(12) United States Patent
Blaauw et al.

(10) Patent No.: US 7,263,015 B2
(45) Date of Patent: Aug. 28, 2007

(54) ADDRESS DECODING

(75) Inventors: David Theodore Blaauw, Ann Arbor, MI (US); David Michael Bull, Balsham (GB); Shidhartha Das, Ann Arbor, MI (US)

(73) Assignees: ARM Limited, Cambridge (GB); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 11/267,574

(22) Filed: Nov. 7, 2005

(65) Prior Publication Data

US 2007/0103995 A1    May 10, 2007

(51) Int. Cl.
*G11C 7/00* (2006.01)
*G11C 8/00* (2006.01)

(52) U.S. Cl. .................. 365/203; 365/230.06; 365/233

(58) Field of Classification Search ................ 365/203, 365/230.06, 233
See application file for complete search history.

(56) References Cited

U.S. PATENT DOCUMENTS

| | | | |
|---|---|---|---|
| 5,699,309 A * | 12/1997 | Cronin et al. ............... | 365/203 |
| 6,269,045 B1 * | 7/2001 | Durham et al. ........ | 365/230.06 |
| 6,501,695 B1 * | 12/2002 | Brown ....................... | 365/203 |
| 6,621,758 B2 * | 9/2003 | Cheung et al. ........ | 365/230.03 |
| 7,064,992 B2 * | 6/2006 | Bell et al. .................... | 365/203 |
| 7,085,190 B2 * | 8/2006 | Worley et al. ......... | 365/230.06 |

* cited by examiner

*Primary Examiner*—Trong Phan
(74) *Attorney, Agent, or Firm*—Nixon & Vanderhye P.C.

(57) ABSTRACT

A signal capture element for providing a first pre-charged logic level as first and second interim address portion signals during a pre-charged period and outputting during an evaluate period an address portion logic level as the first interim address portion signal and an inverted address portion logic level as the second interim address portion signal. First and second address portion signals are derivable respectively from first and second interim address portion signals. An inverter circuit for outputting to an address decoder during a pre-charged period a second pre-charged logic level as the first and second address portion signals. The inverter circuit having transfer characteristics that maintain voltage levels such that the first and second address portion signals are interpreted to be at the second pre-charged logic level despite the first or second interim address portion signal failing to transition to a valid logic level during the evaluate period.

19 Claims, 6 Drawing Sheets

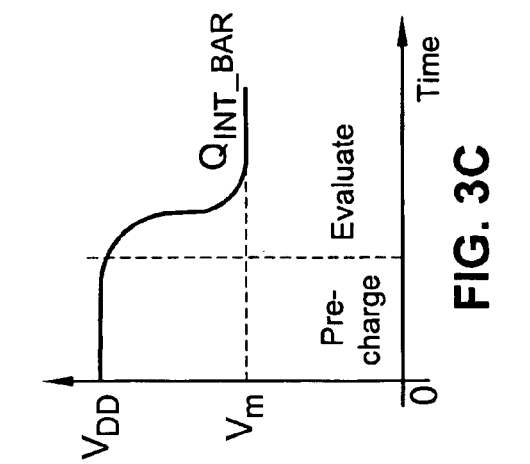
FIG. 3A PRIOR ART
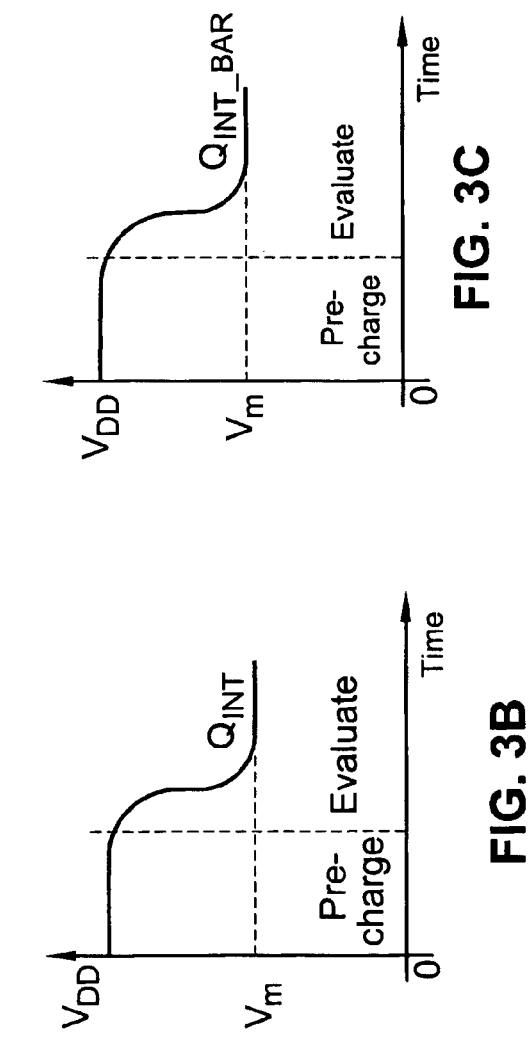
FIG. 3B
FIG. 3C
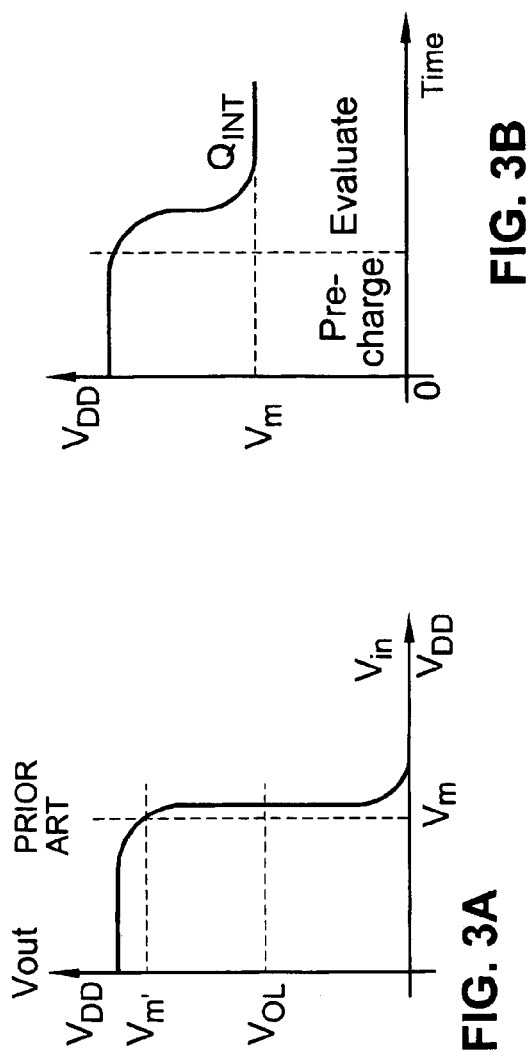
FIG. 3D
FIG. 3E

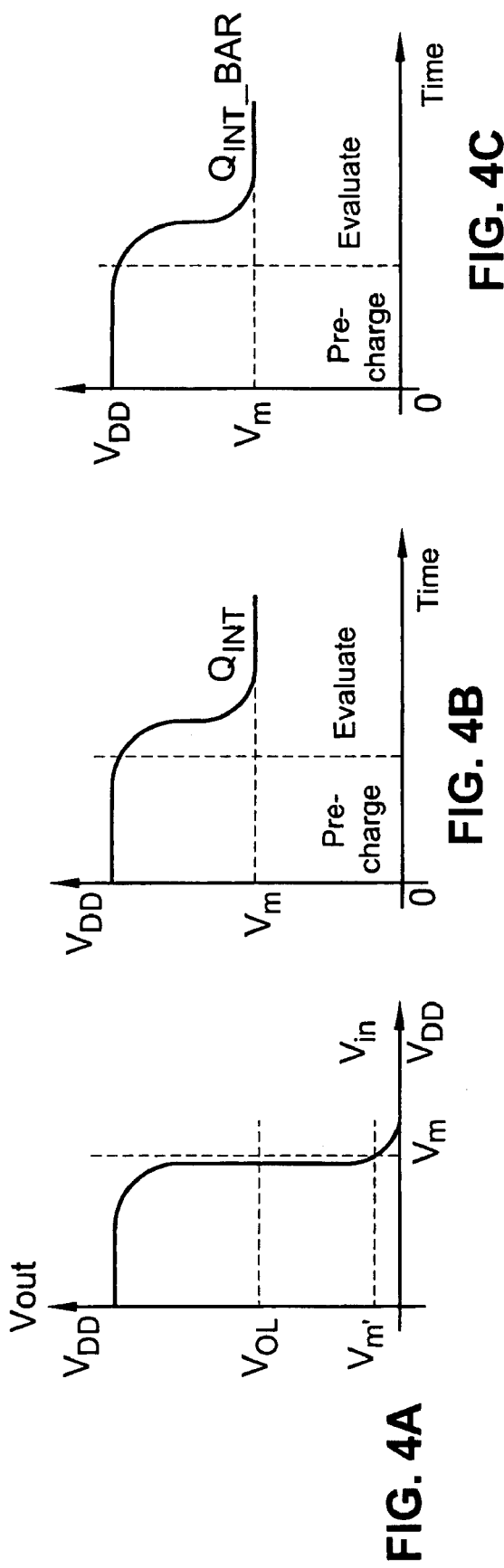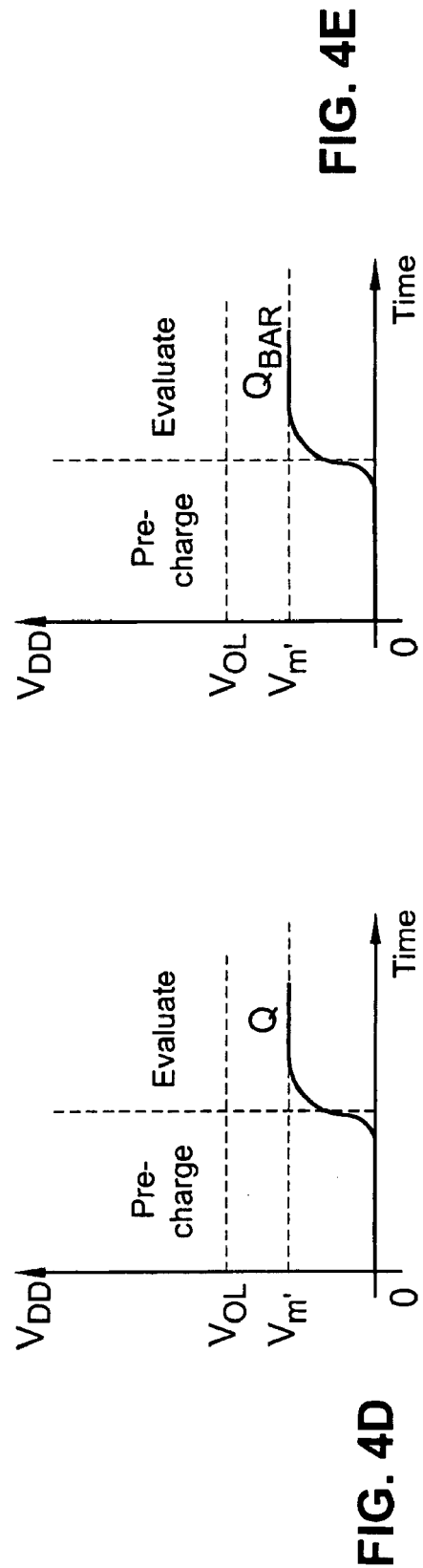
FIG. 4A
FIG. 4B
FIG. 4C
FIG. 4D
FIG. 4E

ADDRESS DECODING

BACKGROUND OF THE INVENTION

1. Field of the Invention

The present invention relates to address decoding. Embodiments of the present invention relate to a circuit for driving an address decoder which is tolerant of metastable signals.

2. Description of the Prior Art

In a data processing apparatus, such as a pipelined data processing apparatus, a series of serially connected stages are formed. The processing circuitry of each processing stage is responsive to input signals received from preceding processing stages in the pipeline or from elsewhere and generates output signals. Between each stage of the pipeline is provided a signal capture element such as a latch or a sense amplifier into which one or more signal values are stored. The latch receives the input signals, stores the input signal value and presents this stored value on its output in response to a clock signal provided thereto.

In order for the latch to reliably store the input signals provided at its input, it is necessary for the input signal to achieve a particular voltage level representative of a value to be stored at a time which is no later than a predetermined period prior to the clock signal being provided to the latch (known as the set-up period) and for this voltage level to be maintained for a predetermined period following the provision of the clock signal (known as the hold period).

However, in the event that the input signals provided to the latch transitions in the set-up or hold period then metastability can occur. A consequence of this is that the output provided by the latch does not make a clean transition between logic levels but instead achieves a value somewhere therebetween, known as a metastable voltage. Typically, the metastable voltage is a level approximately midway between the valid logic level voltages.

Metastability is typically avoided by ensuring that the input signals only transition outside of the set-up and hold periods. This ensures that the input signals can be cleanly sampled by the latch.

However, in order to attempt to improve the performance of data processing apparatuses, it is known to increase the speed at which the processing stages are driven by increasing the clock rate until the slowest processing stage in the pipelined processor is unable to keep pace. Also, in situations where it is desired to reduce the power consumption of the data processing apparatus, it is known to reduce the operating voltage up to the point at which the slowest processing stage is no longer to keep pace. In both of these situations it is no longer possible to ensure that the signal transitions do not occur within the set-up and hold periods and metastability can occur.

A consequence of such metastability is that erroneous data values may be generated. In extreme cases, erroneous control signals may also be generated which may cause valid data to be corrupted. For example, should metastability occur whilst performing an access to a memory then a corruption of the internal state of the memory may occur.

In order to avoid metastability causing corruption of the internal state of the RAM, it is known to place write accesses to the RAM in a write queue. The write accesses are then only allowed to occur once system level validation process has confirmed that the signals associated with the write access are valid and that no metastability in those signals exists.

It is desired to provide techniques for accessing memory which are tolerant of metastable signals.

SUMMARY OF THE INVENTION

According to one aspect of the present invention there is provided a signal interface for interfacing with an address decoder, the signal interface comprising: a signal capture element operable to receive an address portion signal associated with a read access to a memory and to provide a first interim address portion signal and a second interim address portion signal, the signal capture element being operable during a pre-charged period to provide a first pre-charged logic level as the first interim address portion signal and the first pre-charged logic level as the second interim address portion signal, the signal capture element being further operable during an evaluate period to output an address portion logic level representative of the address portion signal as the first interim address portion signal and an inverted address portion logic level representative of an inverted address portion signal as the second interim address portion signal; and an inverter circuit operable to receive the first interim address portion signal and the second interim address portion signal from which a first address portion signal and a second address portion signal is respectively derived, the inverter circuit being operable during the pre-charged period to output to an address decoder a second pre-charged logic level as the first address portion signal and the second pre-charged logic level as the second address portion signal, the receipt of the first address portion signal and the second address portion signal at the second pre-charged logic level causing the address decoder to be prevented from causing a data access to the memory from occurring, the inverter circuit having transfer characteristics which cause the first address portion signal and the second address portion signal to be maintained at voltage levels interpreted by the address decoder as being the second pre-charged logic level should the first interim address portion signal or the second interim address portion signal fail to transition to a valid logic level during the evaluate period.

The present invention recognises that placing read accesses to the memory in a read queue in an equivalent manner to write accesses would introduce delays when retrieving data. This is because read accesses tend to be on the critical path due to the long latency computations required to determine the address values of the data to be read and introducing such delays would adversely reduce the overall performance of the data processing apparatus to unacceptable levels.

However, the present invention also recognises that using signals produced directly by logic which may be metastable could lead to metastable signals in turn being provided to an address decoder used to access the memory. Typically, such address decoders require that received signals achieve specified timing conditions such that metastability will not occur and no mechanisms are provided within the address decoder to deal with such metastable signals.

The present invention further recognises that metastability in the address signals used to drive the address decoder during a read access can potentially cause state corruption in the memory. This is because metastability can result in invalid address signals being provided to the address decoder. These metastable signals can result in invalid address signals being provided because the metastable signals can be interpreted as being at two different logic levels. Such invalid signals may then be directly driven onto the word lines in the memory and could result in the selection of multiple word lines. In a typical memory, selecting multiple word lines simultaneously during a read access can cause a corruption in the state stored in the memory due to the inadvertent flow of charge between cells in different rows of the memory. As mentioned above, such multiple selection of rows is typically avoided in the decoder by specifying set up and hold times which must be observed by signals provided to the address decoder in order to ensure that multiple selection of rows cannot occur. However, as also mentioned above, in the scenario where metastable signals may be generated, observing such timing constraints cannot be guaranteed.

Hence, the transfer characteristics of the inverter circuit of the signal interface for interfacing with an address decoder cause the address portion signals provided to the address decoder to be maintained at voltage levels interpreted by the address decoder as being at the second pre-charged logic level in the event that the first interim address portion signal or the second interim address portion signal are metastable and fail to transition to a valid logic level during the pre-charge or the evaluate period.

Maintaining the address portion signals provided to the address decoder during the evaluate period at voltage levels interpreted by the address decoder as being the second pre-charged logic level causes the address decoder to operate in a manner equivalent to that during the pre-charge period and prevents the address decoder from selecting multiple word lines. As a consequence, no corruption in the state stored in the memory can result due to the inadvertent flow of charge between cells in different rows of the memory.

Accordingly, it remains possible to utilise existing typical arrays of RAM cells, without modification, even in data processing apparatuses in which set-up and hold times are not observed and where metastability may occur. Furthermore, by avoiding the need to place read accesses to the memory in a read queue in an equivalent manner to write accesses avoids the introduction of delays when retrieving data.

In embodiments, the transfer characteristics of the inverter circuit are skewed to cause the first address portion signal and the second address portion signal to be provided at voltage levels interpreted by the address decoder as being the second pre-charged logic level should the first interim address portion signal or the second interim address portion signal fail to transition to a valid logic level during the evaluate period.

In embodiments, the transfer characteristics of the inverter circuit cause the first address portion signal and the second address portion signal to be provided within a range of voltage levels interpreted by the address decoder as being the second pre-charged logic level should the first interim address portion signal or the second interim address portion signal transition to a metastable voltage level.

In embodiments, the transfer characteristics of the inverter circuit cause the first address portion signal and the second address portion signal not to transition out of a voltage range interpreted by the address decoder as being the second pre-charged logic level should the first interim address portion signal or the second interim address portion signal transition to a metastable voltage level.

In embodiments, the metastable logic level is a voltage level approximately mid-way between valid input logic levels.

In embodiments, the voltage range is bounded by the second pre-charged logic level and a threshold level.

In embodiments, the threshold level is a voltage level approximately mid-way between valid output logic levels.

In embodiments, the transfer characteristics of the inverter circuit is a non-symmetric 'S'-curve which provides a small change in the first address portion signal and the second address portion signal in response to a corresponding large change in the first interim address portion signal or the second interim address portion signal.

In embodiments, receipt of the first address portion signal and the second address portion signal at the second pre-charged logic level causes the address decoder to be prevented from activating data selection circuitry in a memory.

According to a second aspect of the present invention there is provided a method of interfacing with an address decoder, comprising the steps of: receiving an address portion signal associated with a data access to a memory and providing a first interim address portion signal and a second interim address portion signal; providing, during a pre-charged period, a first pre-charged logic level as the first interim address portion signal and the first pre-charged logic level as the second interim address portion signal; outputting, during an evaluate period, an address portion logic level representative of the address portion signal as the first interim address portion signal and an inverted address portion logic level representative of an inverted address portion signal as the second interim address portion signal; and receiving the first interim address portion signal and the second interim address portion signal from which a first address portion signal and a second address portion signal is respectively derived; outputting to an address decoder, during the pre-charged period, a second pre-charged logic level as the first address portion signal and the second pre-charged logic level as the second address portion signal, the receipt of the first address portion signal and the second address portion signal at the second pre-charged logic level causing the address decoder to be prevented from causing a data access to the memory from occurring; and causing the first address portion signal and the second address portion signal to be maintained at voltage levels interpreted by the address decoder as being the second pre-charged logic level should the first interim address portion signal or the second interim address portion signal fail to transition to a valid logic level during the evaluate period.

According to a third aspect of the present invention there is provided a memory decoder comprising: a signal capture element for receiving an address portion signal associated with a data access to a memory, for providing a first interim address portion signal and a second interim address portion signal, for providing during a pre-charged period, a first pre-charged logic level as the first interim address portion signal and the first pre-charged logic level as the second interim address portion signal and for outputting during an evaluate period an address portion logic level representative of the address portion signal as the first interim address portion signal and an inverted address portion logic level representative of an inverted address portion signal as the second interim address portion signal; and an inverter circuit operable for receiving the first interim address portion signal and the second interim address portion signal from which a first address portion signal and a second address portion signal is respectively derived, for outputting to an address decoder during the pre-charged period a second pre-charged logic level as the first address portion signal and the second pre-charged logic level as the second address portion signal, the receipt of the first address portion signal and the second address portion signal at the second pre-charged logic level causing the address decoder to be prevented from causing a data access to the memory from occurring, the inverter circuit having transfer characteristics for causing the first address portion signal and the second address portion signal to be maintained at voltage levels interpreted by the address decoder as being the second pre-charged logic level should the first interim address portion signal or the second interim address portion signal fail to transition to a valid logic level during the evaluate period.

BRIEF DESCRIPTION OF THE DRAWINGS

Embodiments of the present invention will now be described with reference to the accompanying drawings in which:

FIGS. 3a to 3e illustrate the characteristics and operation of a signal interface under metastable conditions when using conventional inverters;

FIGS. 4a to 4e illustrate the characteristics and operation of the signal interfaces shown in FIG. 1 under metastable conditions;

DESCRIPTION OF THE EMBODIMENTS

Figure 1:
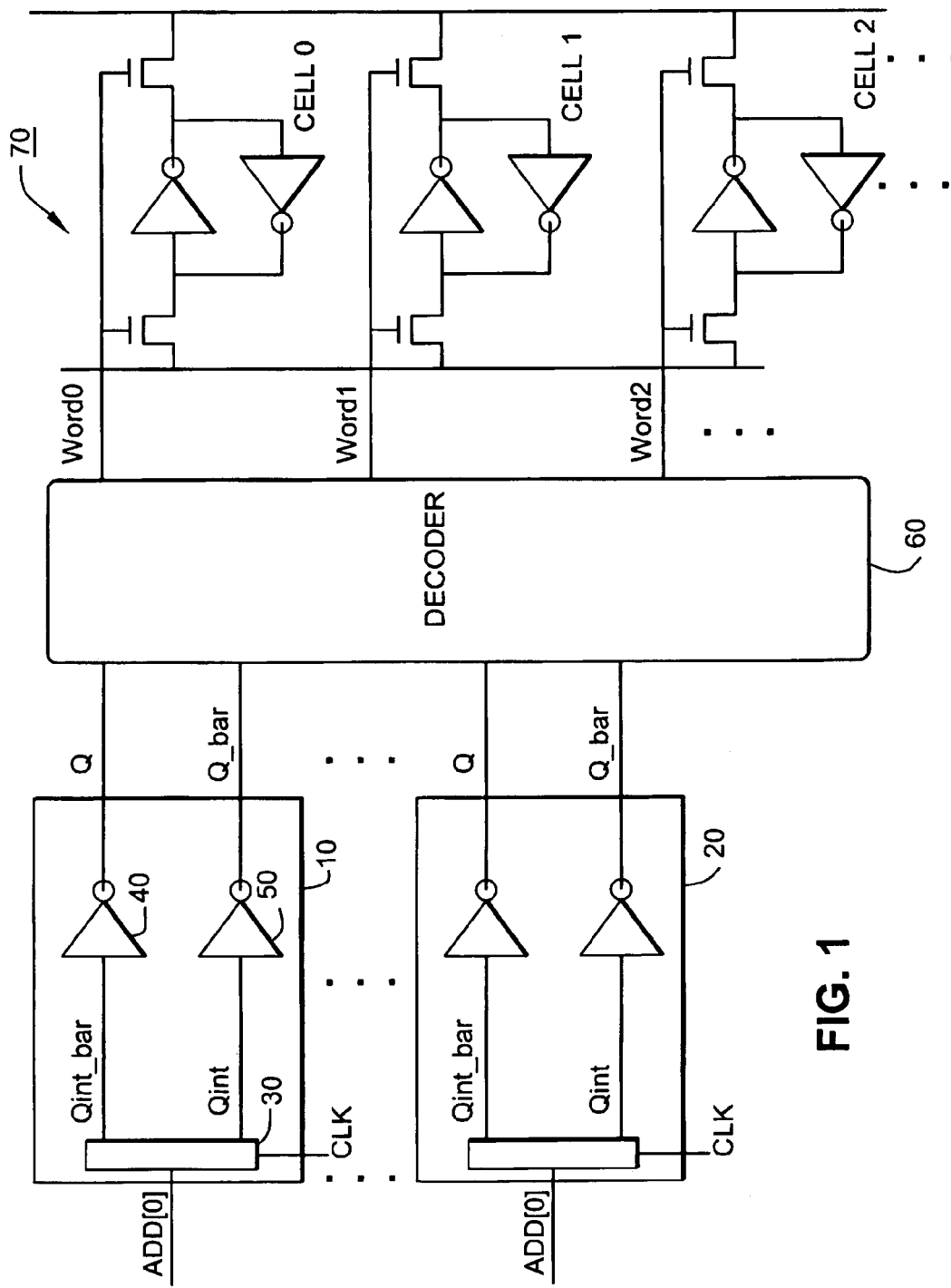
FIG. 1 illustrates a number of signal interfaces according to an embodiment of the present invention.

FIG. 1 illustrates a number of signal interfaces 10, 20 according to an embodiment of the present invention, each operable to interface with an address decoder 60 and a memory 70.

Each signal interface 10, 20 comprise a precharge/evaluate circuit 30 and inverters 40 and 50. As will be explained in more detail below, the characteristics of these inverters 40 and 50 are selected to enable the associated signal interface to receive metastable signals whilst ensuring that no data corruption occurs in the memory 70. Each precharge/evaluate circuit 30 receives a portion of an address signal relating to an address to be accessed in the memory 70. In this embodiment, signal interface 10 receives bit 0 (ADD[0]) of the address value to be accessed in the memory 70, another signal interface receives bit 1 (ADD[1]) of the address value to be accessed in the memory 70, signal interface 20 receives bit n (ADD[n]) of the address value to be accessed in the memory 70, and so on.

Each precharge/evaluate circuit 30 operates in a precharge mode and a evaluate mode. During the precharge mode, the precharge/evaluate circuit 30 is arranged to output signals Qint and Qint_bar having the same logic value to the respective inverters 40, 50. The internal logic of address decoder 60, on receipt of the Qint and Qint_bar signals having the same precharge logic value, prevents any of the word lines in the memory 70 from being selected.

During the evaluate mode, the inverters invert signals Qint and Qint_bar and provide logically inverted signals Q and Q_bar with respect to each other to the address decoder 60. Hence, during the evaluate phase, in normal operation, bit 0 (ADD[0]) of the address value provided to the signal interface 10 will be output as the address portion signal Q to the address decoder 60. The address decoder 60 also receives the logically inverse value of bit 0 (ADD[0]) of the address value as the signal Q_bar.

On receipt of the signals Q and Q_bar for each of the address portions of the address to be accessed in the memory 70, the address decoder 60 decodes this address and drives the appropriate single word line with a selection voltage. The operation of such an address decoder 60 to enable the appropriate word line to be selected will be readily known to the person of ordinary skill. Such an arrangement is often referred to as a "one hot word line selection" arrangement.

Hence, in normal operation, the address decoder receives from each signal interface 10, 20, etc. signals Q and Q_bar, all set at the same precharge voltage levels during the precharge mode which prevents any word lines from being selected, and a number of signals Q which reflect the corresponding bit of the address value during the evaluate phase which causes one word line corresponding to that address value to be selected.

However, as can be seen from the arrangement of the memory 70, a problem can occur if the one hot property of the address decoder 60 is not maintained. The memory is composed of 6T SRAM cells. For example, in the event that wordlines Word0, Word1 and Word2 (see FIG. 1) are simultaneously activated for a read access, the state stored in CELL1 and CELL2 will overwrite this data stored in CELL0 due to charge leakage between these cells because the arrangement of these cells is bi-directional. Accordingly, even during a read access, it is possible for the data stored in the memory 70 to be changed. It will be appreciated, that such changing or corruption of data is highly undesirable since it will not be readily apparent that the corruption has occurred, nor will it be apparent how the corruption occurred. Accordingly, it will be assumed that the data stored in the memory 70 is in fact valid when in reality it is not.

As mentioned previously, it is not normally possible to cause multiple word lines to be driven simultaneously since the signals provided to the address decoder 60 are assumed to satisfy predetermined conditions. Hence, the address decoder 60 will expect to receive Q and Q_bar at a pre-charged logic level, for example a logic level 0 (represented by a voltage GND), therefore Qint and Qint_bar will be set at a logic level 1 (represented by a voltage VDD). The address decoder 60 will not assert any word lines if Q and Q_bar are both at a logic level 0. Furthermore, during the evaluate phase, the address decoder 60 will expect to receive the signal Q having a logic value representing a logic level representing the value of bit 0 (ADD[0]) of the address value, and receive the signal Q_bar having a logic value representing a logic level representing the inverse value of bit 0 (ADD[0]) of the address value. For example, if the value of bit 0 (ADD[0]) of the address value is at logic level 1 (represented by voltage level VDD), then the address decoder will expect the signal Q to be at VDD and Q_bar to be at 0V (representing logic level 0). Conversely, when the value of bit 0 (ADD[0]) of the address value is at logic level 0 then the address decoder will assume that the signal Q is at 0V and the signal Q_bar is at VDD.

Hence, it can be seen, that under normal operating conditions it is not possible to provide both the signal Q at VDD and the signal Q_bar at VDD to the address decoder 60. Accordingly, the address decoder 60 specifies that providing the signals Q and Qint_bar at VDD is invalid because the one hot property of driving word lines cannot be guaranteed and data corruption may occur.

However, as will be explained in more detail below, it is possible in conventional signal interfaces for metastability to cause such an invalid combination of values to be provided to the address decoder 60 which can result in data corruption occurring in the memory 70.

Figure 2:
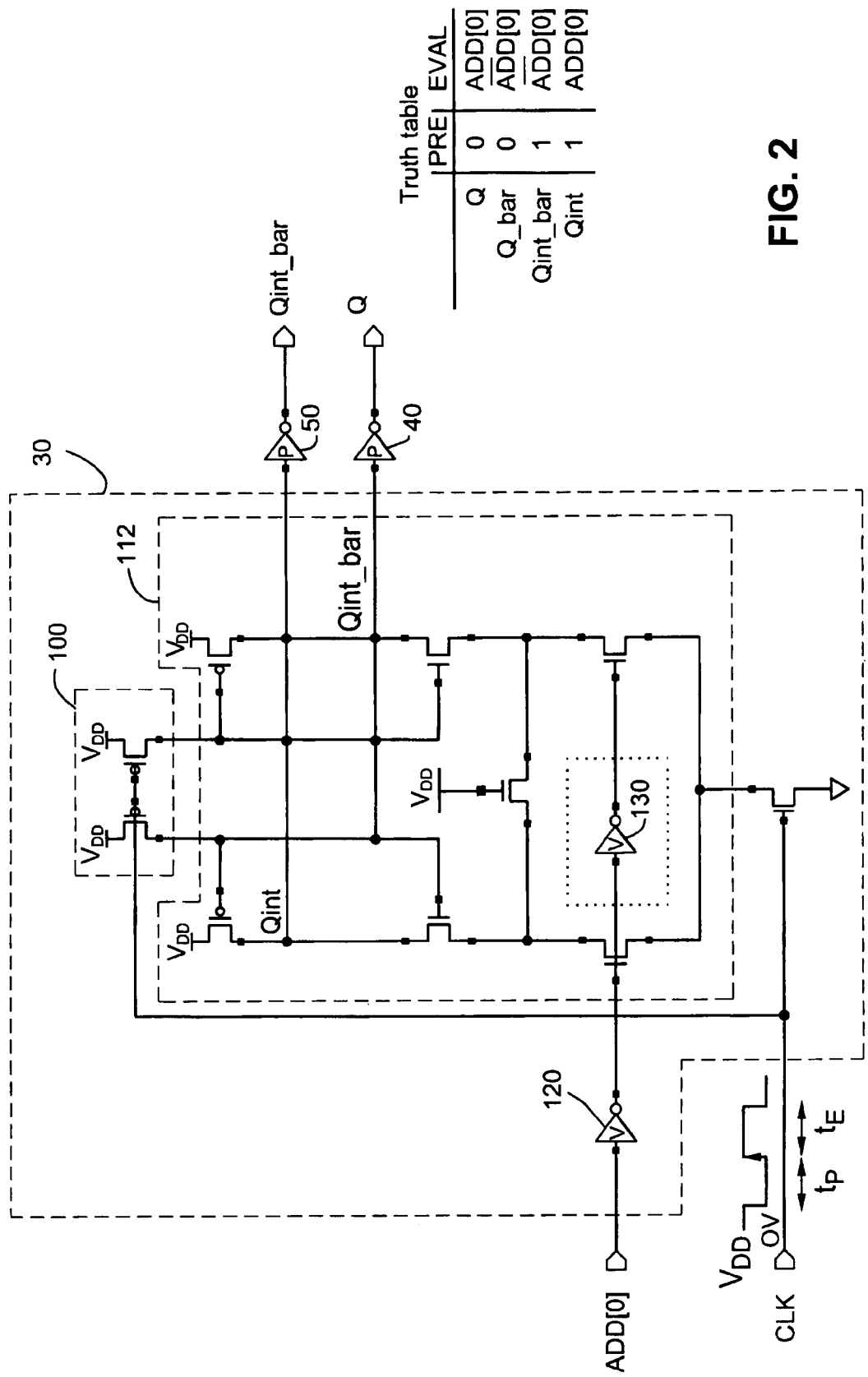
FIG. 2 illustrates in more detail the arrangement of the signal interface shown in FIG. 1.

Before describing how conventional signal interfaces cause an invalid combination of values to be provided to the address decoder 60, the arrangement of the signal capture element 10 will firstly be described in more detail with reference to FIG. 2.

The signal interface 10 comprises a precharge/evaluate circuit 30 and the inverters 40, 50.

The precharge/evaluate circuit 30 is of a generic clock-based precharge and data-based conditional evaluate architecture configuration known in the art and will only be described briefly.

When the clock signal CLK (see FIG 2) is at a logic level 0(0V), denoting the precharge period $t_p$, the transistors in the precharge enable circuit 100 switch on which then causes the signals Qint and Qint_bar to become VDD (representing a logic level 1). In turn, the inverters 40, 50 will provide Q and Q_bar having a value of 0V (representing a logic level 0). Thus, in the precharge phase, the outputs are precharged to a low logic level. Value of the signals in the precharge phase are summarized in the column "PRE" of the Truth Table of FIG. 2.

On the transition of the clock signal CLK (see FIG. 2) to VDD, denoting the evaluate phase, $t_E$, the precharge enable circuit 100 is deactivated and the value of the signal ADD[0] is evaluated by the evaluate circuit 112. In the event that the value of the signal ADD[0] is at a value representing a logic level 0 then the inverter 120 will output a logic level 1 and the inverter 130 will output a logic level 0. Accordingly, the value of Qint_bar will be logic level 1 and the inverter 40 will output Q having a logic level 0. Conversely, the value of Qint will become a logic level 0 and the inverter 50 will output the signal Q_bar having a logic level of 1.

Similarly, when the value of the signal ADD[0] is at a value representing a logic level 1 then the inverter 120 will output a logic level 0 and the inverter 130 will output a logic level 1. Accordingly, the value output as Qint_bar is at a logic level 0 and the value of Q becomes 1, whereas the value of Qint will be at a logic level 1 and the value of O_bar will be at a logic level 0. In this way, it can be seen that it should be possible only to provide valid signals to the address decoder 60. Values of the signals in the evaluate phase are summarized in the column "EVAL" in the Truth Table of FIG. 2.

Thus on the rising clock edge, depending on the value of the input signal, either the Q or Qint_bar outputs evaluate (i.e. typically only one of the outputs will transition whilst the other remains the same), and the address decoder 60 activates a word line in the memory 70 based on the latched addresses.

FIGS. 3a-3e illustrate the operation of the signal interface under metastable conditions when conventional inverters are used in place of the inverters 40 and 50.

The conventional inverters have transfer characteristics as illustrated in FIG. 3a. As can be seen from the transfer characteristics of these inverters, when the input voltage (Vin) to the inverter is 0 volts the output voltage (Vout) is VDD. Conversely, when the Vin is VDD, Vout is 0 volts.

The transfer characteristics of the transition between VDD and 0 volts are such that as Vin reduces from VDD, the Vout reacts very rapidly and increases to VDD. This transition is non-linear. Hence, for a small reduction in the voltage Vin a corresponding large increase occurs in Vout. Indeed, in such a conventional inverter, this non-linear characteristic is desirable since it enables the inverter to rapidly transition from a precharged output voltage of 0 to the evaluated voltage VDD (if required) as quickly as possible.

Whilst these conventional characteristics clearly have some advantages, a problem with this arrangement is that the inverter becomes very susceptible to metastability.

To illustrate this, FIGS. 3b and 3c show the transition of the Qint signal (which is input to an inverter) and Qint_bar (which is also input to an inverter) when metastability occurs. As can be seen, the signals Qint and Qint_bar are both at VDD during the precharge phase. During the evaluate phase, the signals Qint and Qint_bar become metastable and transition to a metastable voltage level Vm. Vm is typically somewhere approximately at a mid-value between VDD and 0V (however, it will be appreciated that the metastable voltage may be a value anywhere between VDD and 0V).

Because the transfer characteristics of the inverter responds rapidly to the reduction in the value of Qint and Qint_bar, the output of the associated inverter rises rapidly to a value Vm'. As can be seen from FIGS. 3D and E, because of these conventional transfer characteristics, the value of Vm' is not mid-way between VDD and 0V, but is in fact more towards VDD than 0V. A consequence of this is that the value Vm' will typically fall above a logic level threshold Vol, above which voltage values are interpreted as being a logic level 1. Accordingly, as a result of the metastability in the Qint or the Qint_bar signals, the conventional inverters will both output signals which will be interpreted by the address decoder as being a logic level 1.

As mentioned previously, such an input to the address decoder 60 is invalid and will destroy the one-hot property of the memory 70, thereby causing multiple word lines to be selected and resulting in corruption in the data stored in the cells.

In summary, when the signals providing the address data transitions close to a clock edge, metastablity can occur. This can cause one of Q and Q_bar to be partially evaluated. These signals will transition to the metastable voltage Vm and hover around until a noise impulse disturbs the unstable equilibrium which causes the Vout to switch to a valid logic level. Once resolved, one of the outputs Q or Qint_bar will then transition to a logic level one after a delay equal to the metastability resolution time. However, in the meantime, data may have been corrupted in the memory 70.

Hence, the transfer characteristics of the inverters 40 and 50 are selected in order to prevent such a combination of invalid signals being provided to the address decoder 60 under metastable conditions.

FIG. 4a illustrates the transfer characteristics of the inverters 40 and 50. As can be seen from the transfer characteristics of these inverters, when the input voltage (Vin) to the inverter is 0 volts the output voltage (Vout) is VDD. Conversely, when the Vin is VDD, Vout is 0 volts.

However, the transfer characteristics are also non-linear. The transfer characteristics are an 'S'-curve which is skewed in order to prevent the inverter from being so responsive to changes to Vin. The 'S'-curve is non-symmetric. Hence, the transfer characteristics are such that as Vin reduces from VDD, Vout reacts very slowly and remains near 0V. Hence, for a large reduction in the voltage Vin, a small increase occurs in Vout. Indeed, by the time that Vin has reduced to approximately VDD/2, Vout is still well below the threshold voltage level Vol which means that Vout will still be interpreted as being at logic level 0.

It will be appreciated that this will increase the time taken for the inverters 40, 50 to transition during the evaluate period.

To illustrate this, FIGS. 4b and 4c show the voltages Qint and Qint_bar under metastable conditions.

During the precharge period, both Qint and Qint_bar are precharged to the voltage VDD.

During the evaluate phase, the voltage Qint and Qint_bar both transition to a metastable voltage Vm. The metastable voltage Vm is typically approximately VDD/2. Signals Qint and Qint_bar both then hover at around the voltage Vm during the evaluate phase. The signals Qint and Qint_bar at the metastable voltage Vm are provided to the input of the inverters 40 and 50.

As can be seen from FIGS. 4D and E, the signals Q and Qint_bar output by the inverters 40 and 50 have a voltage level Vm'. However, due to the transfer characteristics of the inverters 40 and 50, Vm' now fall well below the threshold voltage Vol. Because Vm' falls well below the threshold voltage Vol, the address decoder will still interpret these voltages as being a logic level 0, which is the same as the precharge logic levels and which are valid input signals to the address decoder 60. This in turn prevents any of the word lines from being selected in the memory 70.

Accordingly, it can be seen that even under metastable conditions, no data access will occur to the memory 70. This is because the address decoder 60 has a certain minimum voltage level below which all voltages are interpreted as being low. Hence, if the inverters 40 and 50 are selected such that under a metastable input voltage their output is guaranteed to be lower than Vol, then the address decoder 60 will never receive anything other than the precharge voltage level under metastable conditions. Hence, the address decoder 60 will never switch under metastability and therefore the one-hot property of the address decoder 60 will never be violated. Because the one hot property of the address decoder 60 is never violated, the cells in the memory 70 can never become corrupt due to metastability.

Figure 5:
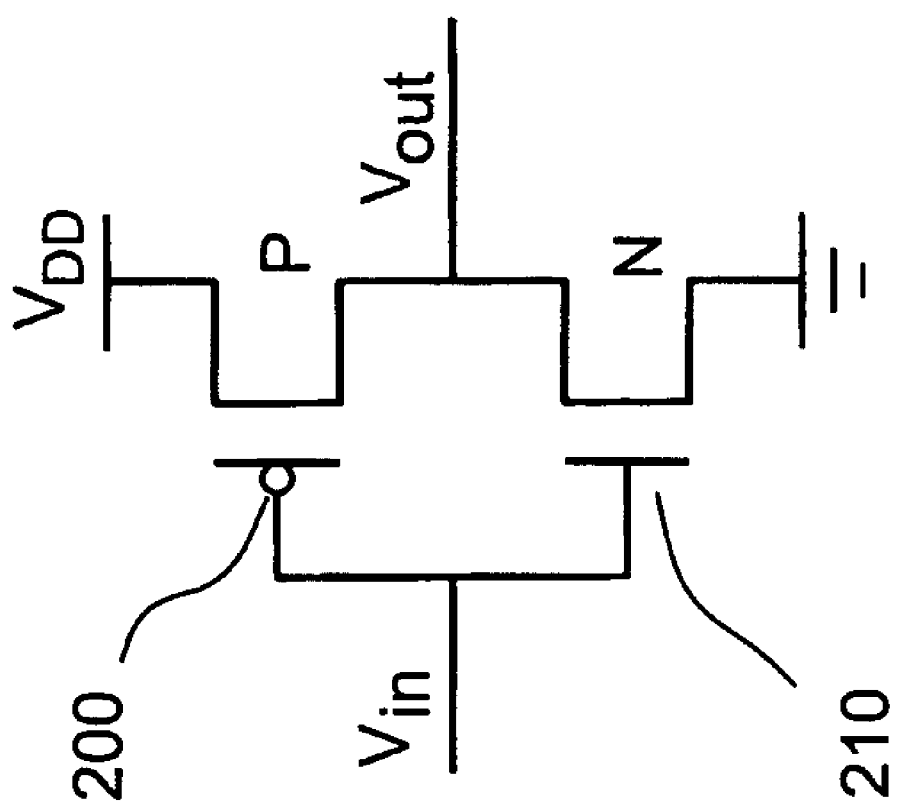
FIG. 5 illustrates in more detail the arrangement of the inverters 40 and 50 shown in FIG. 1.

FIG. 5 illustrates in more detail the arrangement of the inverters 40 and 50. In order to achieve the desired characteristics it is necessary to decrease the on-resistance of the PMOS transistor 200 and/or increase the on-resistance of the NMOS transistor 210. It will be appreciated that the on-resistance of the P mos transistor can readily be decreased by increasing the width of its channel.

Although a particular embodiment of the invention has been described herewith, it will be apparent that the invention is not limited thereto, and that many modifications and additions may be made within the scope of the invention. For example, various combinations of the features from the following dependent claims could be made with features of the independent claims without departing from the scope of the present invention.

Figure 6:
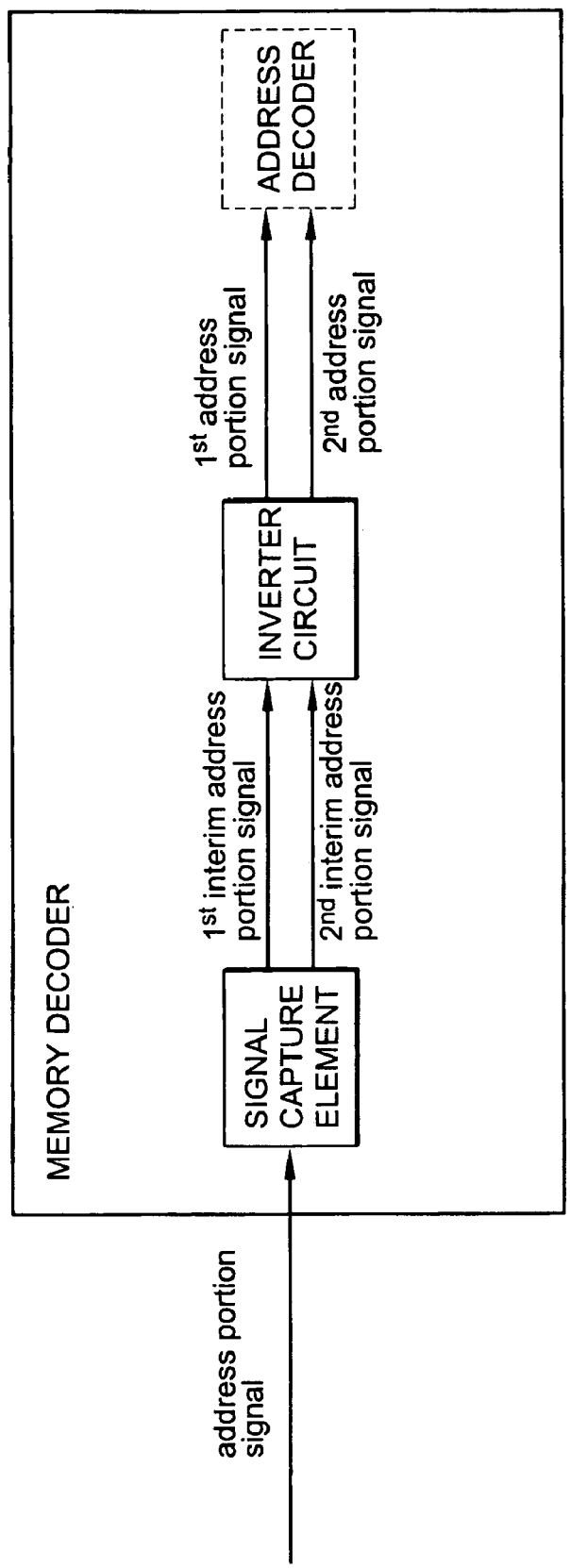
FIG. 6 schematically illustrates a memory decoder according to an embodiment of the present invention.

FIG. 6 schematically illustrates an embodiment in which a memory decoder comprises a signal capture element and an inverter circuit according to the present technique.

We claim:

1. A signal interface for interfacing with an address decoder, said signal interface comprising:
   a signal capture element operable to receive an address portion signal associated with a data access to a memory and to provide a first interim address portion signal and a second interim address portion signal,
   said signal capture element being operable during a pre-charged period to provide a first pre-charged logic level as said first interim address portion signal and said first pre-charged logic level as said second interim address portion signal,
   said signal capture element being further operable during an evaluate period to output an address portion logic level representative of said address portion signal as said first interim address portion signal and an inverted address portion logic level representative of an inverted address portion signal as said second interim address portion signal; and
   an inverter circuit operable to receive said first interim address portion signal and said second interim address portion signal from which a first address portion signal and a second address portion signal is respectively derived, said inverter circuit being operable during said pre-charged period to output to an address decoder a second pre-charged logic level as said first address portion signal and said second pre-charged logic level as said second address portion signal, receipt by said address decoder of said first address portion signal and said second address portion signal at said second pre-charged logic level causing said address decoder to be prevented from causing a data access to said memory from occurring, said inverter circuit having transfer characteristics which cause said first address portion signal and said second address portion signal to be maintained at voltage levels interpreted by said address decoder as being said second pre-charged logic level should said first interim address portion signal or said second interim address portion signal fail to transition to a valid logic level during said evaluate period.

2. The signal interface as claimed in claim 1, wherein said transfer characteristics of said inverter circuit are skewed to cause said first address portion signal and said second address portion signal to be provided at voltage levels interpreted by said address decoder as being said second pre-charged logic level should said first interim address portion signal or said second interim address portion signal fail to transition to a valid logic level during said evaluate period.

3. The signal interface as claimed in claim 1, wherein said transfer characteristics of said inverter circuit cause said first address portion signal and said second address portion signal to be provided within a range of voltage levels interpreted by said address decoder as being said second pre-charged logic level should said first interim address portion signal or said second interim address portion signal transition to a metastable voltage level.

4. The signal interface as claimed in claim 1, wherein said transfer characteristics of said inverter circuit cause said first address portion signal and said second address portion signal not to transition out of a voltage range interpreted by said address decoder as being said second pre-charged logic level should said first interim address portion signal or said second interim address portion signal transition to a metastable voltage level.

5. The signal interface as claimed in claim 4, wherein said metastable logic level is a voltage level approximately mid-way between valid input logic levels.

6. The signal interface as claimed in claim 4, wherein said voltage range is bounded by said second pre-charged logic level and a threshold level.

7. The signal interface as claimed in claim 6, wherein said threshold level is a voltage level approximately mid-way between valid output logic levels.

8. The signal interface as claimed in claim 1, wherein said transfer characteristics of said inverter circuit is a non-symmetric 'S'-curve which provides a small change in said first address portion signal and said second address portion signal in response to a corresponding large change in said first interim address portion signal or said second interim address portion signal.

9. The signal interface as claimed in claim 1, wherein receipt of said first address portion signal and said second address portion signal at said second pre-charged logic level causes said address decoder to be prevented from activating data selection circuitry in a memory.

10. A method of interfacing with an address decoder, comprising the steps of:
receiving an address portion signal associated with a data access to a memory and providing a first interim address portion signal and a second interim address portion signal;
providing, during a pre-charged period, a first pre-charged logic level as said first interim address portion signal and said first pre-charged logic level as said second interim address portion signal;
outputting, during an evaluate period, an address portion logic level representative of said address portion signal as said first interim address portion signal and an inverted address portion logic level representative of an inverted address portion signal as said second interim address portion signal; and
receiving said first interim address portion signal and said second interim address portion signal from which a first address portion signal and a second address portion signal is respectively derived;
outputting to an address decoder, during said pre-charged period, a second pre-charged logic level as said first address portion signal and said second pre-charged logic level as said second address portion signal, receipt by said address decoder of said first address portion signal and said second address portion signal at said second pre-charged logic level causing said address decoder to be prevented from causing a data access to said memory from occurring; and
causing said first address portion signal and said second address portion signal to be maintained at voltage levels interpreted by said address decoder as being said second pre-charged logic level should said first interim address portion signal or said second interim address portion signal fail to transition to a valid logic level during said evaluate period.

11. The method as claimed in claim 10, wherein said step of causing comprises providing an inverter circuit having transfer characteristics skewed to cause said first address portion signal and said second address portion signal to be provided at voltage levels interpreted by said address decoder as being said second pre-charged logic level should said first interim address portion signal or said second interim address portion signal fail to transition to a valid logic level during said evaluate period.

12. The method as claimed in claim 10, wherein said step of causing comprises providing an inverter circuit having transfer characteristics skewed to cause said first address portion signal and said second address portion signal to be provided within a range of voltage levels interpreted by said address decoder as being said second pre-charged logic level should said first interim address portion signal or said second interim address portion signal transition to a metastable voltage level.

13. The method as claimed in claim 10, wherein said step of causing comprises providing an inverter circuit having transfer characteristics skewed to cause said first address portion signal and said second address portion signal not to transition out of a voltage range interpreted by said address decoder as being said second pre-charged logic level should said first interim address portion signal or said second interim address portion signal transition to a metastable voltage level.

14. The method as claimed in claim 13, wherein said metastable logic level is a voltage level approximately mid-way between valid input logic levels.

15. The method as claimed in claim 13, wherein said voltage range is bounded by said second pre-charged logic level and a threshold level.

16. The method as claimed in claim 15, wherein said threshold level is a voltage level approximately mid-way between valid output logic levels.

17. The method as claimed in claim 10, wherein said step of causing comprises providing an inverter circuit having transfer characteristics which comprise a non-symmetric 'S'-curve which provides a small change in said first address portion signal and said second address portion signal in response to a corresponding large change in said first interim address portion signal or said second interim address portion signal.

18. The method as claimed in claim 10, wherein receiving said first address portion signal and said second address portion signal at said second pre-charged logic level causes said address decoder to be prevented from activating data selection circuitry in a memory.

19. A memory decoder comprising:
a signal capture element for receiving an address portion signal associated with a data access to a memory, for providing a first interim address portion signal and a second interim address portion signal, for providing during a pre-charged period, a first pre-charged logic level as said first interim address portion signal and said first pre-charged logic level as said second interim address portion signal and for outputting during an evaluate period an address portion logic level representative of said address portion signal as said first interim address portion signal and an inverted address portion logic level representative of an inverted address portion signal as said second interim address portion signal; and
an inverter circuit operable for receiving said first interim address portion signal and said second interim address portion signal from which a first address portion signal and a second address portion signal is respectively derived, for outputting to an address decoder during said pre-charged period a second pre-charged logic level as said first address portion signal and said second pre-charged logic level as said second address portion signal, receipt by said address decoder of said first address portion signal and said second address portion signal at said second pre-charged logic level causing said address decoder to be prevented from causing a data access to said memory from occurring, said inverter circuit having transfer characteristics for causing said first address portion signal and said second address portion signal to be maintained at voltage levels interpreted by said address decoder as being said second pre-charged logic level should said first interim address portion signal or said second interim address portion signal fail to transition to a valid logic level during said evaluate period.

* * * * *